(12) United States Patent
Liu et al.

(10) Patent No.: US 7,102,864 B2
(45) Date of Patent: Sep. 5, 2006

(54) LATCH-UP-FREE ESD PROTECTION CIRCUIT USING SCR

(75) Inventors: James Liu, Hsinchu (TW); Jimmy Hsieh, Hsinchu (TW); Sheng-Lyang Jang, Taipei (TW); Hsueh-Ming Lu, Hsinchuang (TW)

(73) Assignee: King Billion Electronics Co., Ltd., Hsinchu Hsien (TW)

( * ) Notice: Subject to any disclaimer, the term of this patent is extended or adjusted under 35 U.S.C. 154(b) by 262 days.

(21) Appl. No.: 10/866,024

(22) Filed: Jun. 14, 2004

(65) Prior Publication Data

US 2005/0275984 A1    Dec. 15, 2005

(51) Int. Cl.
*H02H 9/00* (2006.01)

(52) U.S. Cl. ......................... 361/56; 327/310

(58) Field of Classification Search ................ 361/56; 327/310
See application file for complete search history.

(56) References Cited

U.S. PATENT DOCUMENTS

| 5,289,334 A | * | 2/1994 | Ker et al. ............... 361/56 |
| 5,504,451 A | * | 4/1996 | Smayling et al. ........... 327/438 |
| 2003/0007301 A1 | * | 1/2003 | Ker et al. ................... 361/111 |
| 2003/0214773 A1 | * | 11/2003 | Kitagawa ..................... 361/118 |
| 2004/0195629 A1 | * | 10/2004 | Lai et al. ..................... 257/355 |

* cited by examiner

*Primary Examiner*—Brian Sircus
*Assistant Examiner*—Ann Hoang
(74) *Attorney, Agent, or Firm*—Lowe Hauptman & Berner

(57) ABSTRACT

A latch-up-free ESD protection circuit using SCR is disclosed, in which an SCR is connected between the input pad and the negative power supply; a turn-on switch and a turn-off switch are connected between the positive power supply $V_{DD}$ (or the input pad) and the SCR; and a transistor gating circuit is connected to the turn-on switch and the turn-off switch to direct the operation of the SCR. When overvoltage stress develops over the input pad in the fast-transient mode, the turn-on switch enables the NPN transistor to switch on the SCR to form a discharging path for electrostatic discharge; and when overvoltage stress is released, the turn-off switch enables the PNP transistor to switch off the SCR, thus making it immune to any latch-up after the overvoltage stress is released, and having the advantages of fast triggering, low trigger voltage, no latch-up, and full ESD protection in the active and passive modes.

20 Claims, 8 Drawing Sheets

LATCH-UP-FREE ESD PROTECTION CIRCUIT USING SCR

BACKGROUND OF THE INVENTION

1. Field of the Invention

The present invention is related to a latch-up-free ESD protection circuit using an silicon controlled rectifier (SCR), and more particularly to an ESD protection circuit that employs a turn-on switch to turn on an SCR and a turn-off switch to switch off the SCR, whereby plural discharging paths are formed even after another part of the SCR is switched off.

2. Description of Related Art

When an operator touches a semiconductor device, the electrostatic charge stored on the surface of human body is transferred to the device with a burst of high voltage electrostatic charge, thus causing destructive damage to the device. Therefore, an ESD protection circuit is important to the reliable operation of any semiconductor device.

Two ESD protection schemes have been used. The first type of conventional ESD protection circuit employs a pair of gate-insulated MOSFET devices, and can be either a thick-oxide or a thin-oxide MOS device, and these MOSFET devices are connected to bipolar junction transistors. When electrostatic charge is present, the MOSFET devices are enabled and trigger the bipolar junction transistors (BJT) to form discharging paths. Once the electrostatic charge is removed, the MOSFET devices are turned off. One advantage of this ESD protection circuit is that latch-up will never occur, because the forward voltage will fall rapidly below a threshold voltage of the MOSFET device as the transient current flows through the circuit, but the efficiency in electrostatic discharge has not been satisfactory.

The second type of conventional ESD protection circuit, as shown in FIG. 7, uses a silicon controlled rectifier (SCR) (70) coupled by a resistor (71), to be placed across the negative power supply $V_{SS}$, and the positive power supply $V_{DD}$ (or the input pad) where electrostatic discharge frequently occurs. When electrostatic charge builds up over the pad of the semiconductor device, breakdown current is produced to trigger the SCR (70) into conduction, such that a discharging path is created between the positive power supply $V_{DD}$ and the negative power supply $V_{SS}$ for ESD protection on the semiconductor device.

Compared with the previous example of the ESD protection circuit, the SCR (70) has better discharge efficiency. The ESD protection circuit using the SCR provides full ESD protection for semiconductor devices, but its problem is the high trigger voltage.

To correct the problem, many alternative ESD protection circuits are designed, such as a low voltage trigger LVTSCR shown in FIG. 8, a low voltage gate coupled GCSCR shown in FIG. 9, diode chain trigger DCTSCR shown in FIG. 10 and a Zener diode trigger ZDTSCR shown in FIG. 11. However, these circuits are not all without problems.

The ESD protection circuit, as shown in FIG. 9, is formed by low voltage trigger gate coupled SCR (GCSCR). Since the GCSCR only needs a low trigger voltage, the gate coupled SCR is enabled when overvoltage stress develops in the forward fast-transient mode, but this circuit needs to work with an RC circuit. Besides, the SCR will remain in latching after the transient current is stopped, and the circuit cannot tolerate high voltage DC.

The ESD protection circuit (DCTSCR), as shown in FIG. 10, is formed by a diode chain (D1–D4) triggered SCR, which is not only low voltage triggered, but also provides ESD protection in both fast-transient and quasi-static modes, but a more serious problem is the leakage current in forward bias.

ESD protection circuit (ZDTSCR), as shown in FIG. 11, employs a Zener diode triggered SCR. This circuit possesses the advantages of low voltage triggering, and ESD protection in both the fast-transient and quasi-static modes, and the only problem is that it takes longer time to be turned on.

The PMOS/NMOS triggered SCR ESD protection circuit, as shown in FIG. 12, employs a MOSFET circuit (81) to control the NPN transistor and the PNP transistor in the SCR circuit (82). When PMOS of the MOSFET circuit (81) is enabled, the NPN transistor of the SCR circuit (82) is turned on, so the SCR circuit (82) will be triggered into conduction for ESD protection. When NMOS of the MOSFET circuit (81) is enabled, the NPN transistor of the SCR circuit (82) is turned off, causing the SCR circuit (82) to be switched off. The advantage of this circuit design is fast triggering, and the SCR is immediately turned off when the transient current is stopped, but it only provides ESD protection in the fast-transient mode.

In conclusion, it can be seen that current designs of the ESD protection circuits still have many problems, such as leakage current, excessively high trigger voltage, low holding voltage, slow switching, low discharge efficiency, ESD protection only in fast-transient mode etc.

SUMMARY OF THE INVENTION

The main object of the present invention is to provide an ESD protection circuit that enables ESD protection for semiconductor devices but is immune to latch-up in both the fast-transient and quasi-static modes, and the ESD protection circuit also has the advantages of fast switching, high discharge efficiency, and high stability.

To design such an ESD protection circuit, the instrumentalities of the present invention are to use the following circuit architecture comprising:

an SCR being installed across the input pad (PAD) and negative power supply;

a turn-on switch being connected across the positive power supply $V_{DD}$ (or the input pad) and the gate of the SCR to initiate the SCR;

a turn-off switch being connected across the positive power supply $V_{DD}$ (or the input pad) and the gate of the SCR to switch off the SCR; and a transistor gating circuit being connected across the positive power supply $V_{DD}$ (or the input pad) and negative power supplies to control the 'on/off' time of the turn-on switch and the turn-off switch.

According to the present ESD protection circuit, when overvoltage stress develops over the input pad (PAD) in the forward fast-transient mode, the excitation over the positive power supply causes the transistor gating circuit to output a low voltage pulse and a forward voltage is generated to enable the turn-on switch. After the SCR is triggered into conduction, the voltage over the input pad (PAD) rapidly falls to a holding voltage of the SCR as the transient current flows through the circuit, and the SCR is then engaged in conduction, thus providing full protection in electrostatic discharge, and having the advantages of fast switching, high discharge efficiency, and low trigger voltage.

According to the present ESD protection circuit, the SCR is formed by an NPN transistor and a PNP transistor, wherein the diode coupled to the emitter of the PNP transistor is connected to the input pad (PAD) to form an anode of the SCR; the collector of the PNP transistor is connected to the base of the NPN transistor and also through a resistor is connected to the negative power supply $V_{SS}$ to form a cathode of the SCR; and the bases of the PNP transistor and the NPN transistor act as the gate of the SCR.

In the above SCR circuit, the diode coupled to the emitter of the PNP transistor can be replaced by a PMOS.

The turn-on switch is formed by a PMOS and a voltage clamping circuit, wherein the drain of the PMOS is connected to the base of NPN transistor of the SCR circuit, and the gate is connected to the transistor gating circuit; the Zener diode of the voltage clamping circuit is connected across the bases of the PNP and NPN transistors of the SCR circuit to allow electrostatic discharge to go on even when another part of the SCR is switched off.

In the voltage clamping circuit, the Zener diode and a diode are connected back-to-back, whereby when overvoltage stress develops over the input pad (PAD) in the reverse fast-transient mode, the circuit still can provide ESD protection, and it also reduces leakage current of the Zener diode.

The turn-off switch has an NMOS with the source connected to the base of the PNP transistor of the SCR circuit.

The transistor gating circuit is formed by a network of resistor and capacitor, where the junction between the resistor and the capacitor is connected to the gates of the turn-on switch and the turn-off switch. Alternatively, the transistor gating circuit may use different designs but having similar functional characteristics.

Other objectives, advantages and novel features of the invention will become more apparent from the following detailed description when taken in conjunction with the accompanying drawings.

DETAILED DESCRIPTION OF THE PREFERRED EMBODIMENT

Figure 1:
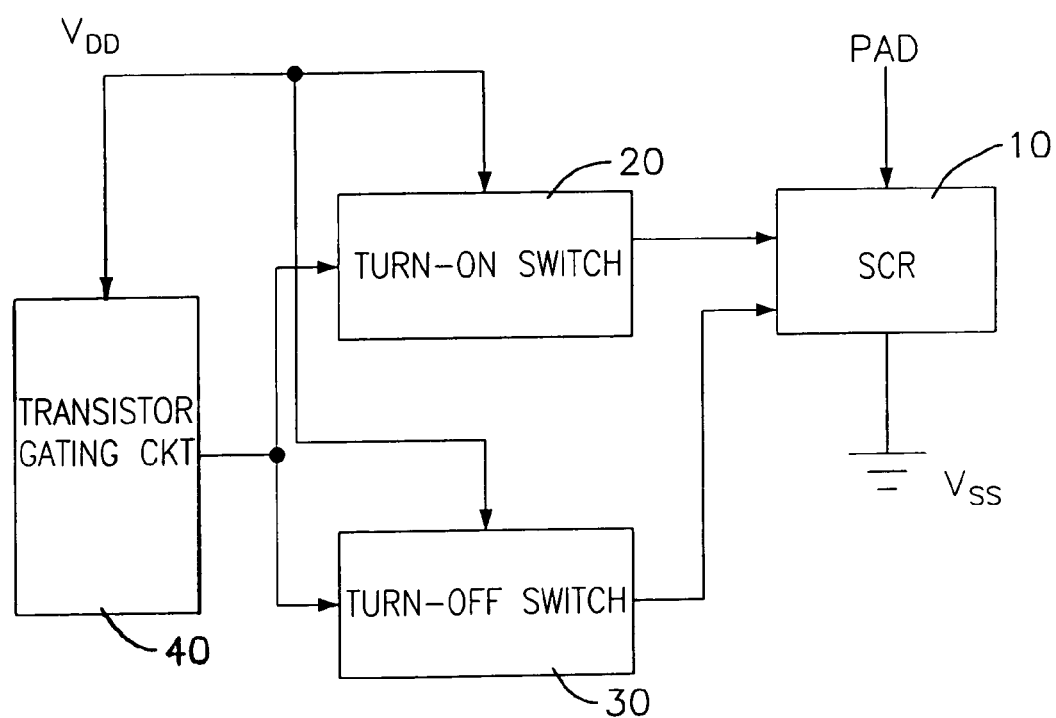
FIG. 1 is a block diagram of the system architecture of the present invention.

The present invention is illustrated through a first preferred embodiment, shown in FIG. 1, that has a circuit structure comprising:

an SCR (10) being installed across the input pad (PAD) and the negative power supply $V_{SS}$;

a turn-on switch (20) being connected between the positive power supply $V_{DD}$ (or the input pad) and the gate of the SCR (10) to initiate the SCR (10);

a turn-off switch (30) being connected between the positive power supply $V_{DD}$ (or the input pad) and the gate of the SCR (10) to switch off the SCR (10); and a transistor gating circuit (40) being connected across the positive power supply $V_{DD}$ (or the input pad) and the negative power supply $V_{SS}$, wherein the transistor gating circuit (40) is respectively connected to the turn-on switch (20) and the turn-off switch (30).

When forward overvoltage stress develops over the input pad (PAD), the stress coupled to the positive power supply $V_{DD}$. Transistor gating circuit (40) sends out a low voltage pulse and a forward voltage is generated to enable the turn-on switch (20) which causes the SCR (10) to be turned on to form plural discharging paths, so the forward voltage will rapidly fall to the level of the holding voltage for the SCR (10), but the electrostatic discharge continues even when another part of the SCR (10) (that is the NPN transistor) is switched off, thus providing full protection in electrostatic discharge.

Figure 2:
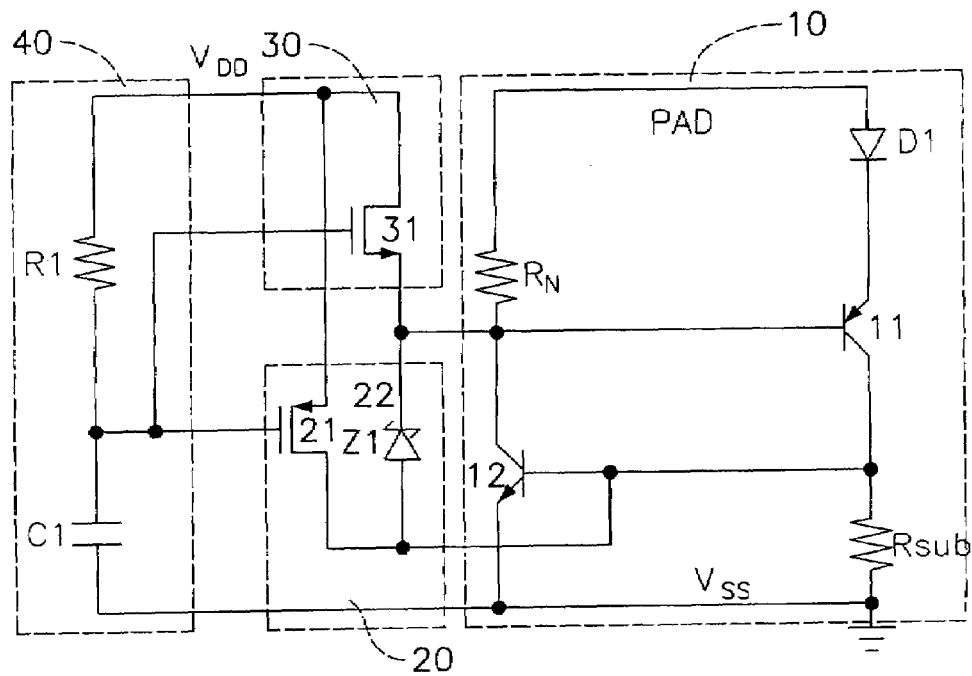
FIG. 2 is a detailed circuit diagram of the first preferred embodiment of the invention.

The detailed circuit diagram of the first preferred embodiment of the invention is shown in FIG. 2, wherein the SCR (10) is formed by a PNP transistor (11) and an NPN transistor (12), both being bipolar junction transistors.

The emitter of the PNP transistor (11) is coupled with a diode D1 to form an anode of the SCR (10);

the base of the PNP transistor (11) is coupled with a resistor $R_N$, which is connected to the input pad (PAD); and the collector of PNP transistor (11) is connected to the base of the NPN transistor (12), and also through a resistor $R_{SUB}$ is connected to the negative power supply $V_{SS}$ to form a cathode of the SCR (10); and the bases of the PNP transistor (11) and the NPN transistor (12) act as the gate of the SCR (10).

The turn-on switch (20) is used to initiate the SCR (10), where the voltage turn-on switch may be implemented in many different ways, such as a drain breakdown for MOSFET, gate coupled, Zener breakdown etc. In this example, the trigger current for the SCR (10) depends on the PMOS (21), where the drain of the PMOS (21) is connected to the base of the NPN transistor (12) of the SCR (10), and the gate is connected to the transistor gating circuit (40) to initiate the SCR (10).

The above turn-on switch (20) has a voltage clamping circuit (22) that employs Zener diode to lower the trigger voltage of SCR (10) and to protect the circuit from high dc voltage, and the Zener diode (Z1) is connected across the bases of PNP and NPN transistors (11) (12) of the SCR (10).

The above turn-off switch (30) also has an NMOS (31), where the source of the NMOS (31) is connected to the base of PNP transistor (11) of the SCR (10), and the gate is connected to the transistor gating circuit (40) to switch off the PNP transistor (11) of the SCR (10).

In this example, the transistor gating circuit (40) is formed by an RC circuit, where one end of the resistor (R1) is connected to the positive power supply $V_{DD}$, another end is connected to a capacitor (C1), and the junction between R1 and C1 is connected across the gates of the turn-on switch (20) and the turn-off switch (30). If the resistance value of R1 and the capacitance value of C1 are suitably adjusted, the time constant of the RC circuit can be used to control the 'on/off' time of the turn-on switch (20) and the turn-off switch (30).

The basic circuit design of the preferred embodiment has been explained, and the actual operation of the ESD protection circuit will be explained next.

When overvoltage stress develops over the input pad (PAD) in the forward fast-transient mode of a semiconductor device, the transistor gating circuit (40) sends out a low voltage pulse and forward voltage is generated to cause the PMOS (21) of the turn-on switch (20) to be turned on, which will trigger the SCR (10) into conduction, and at the same time breakdown current is produced in the Zener diode (Z1) of the voltage clamping circuit (22), so the SCR (10) will be in conduction and the voltage over the input pad (PAD) will rapidly fall to the holding voltage of the SCR (10), thus providing ESD protection.

After the overvoltage stress in the forward fast-transient mode is released, a high voltage pulse is output by the transistor gating circuit (40) and a forward voltage is generated to enable the NMOS (31) of the turn-off switch (30). After the NMOS (31) is turned on, the SCR (10) (that is the PNP transistor) is switched off, so latch-up will never occur, whereas in the conventional ESD protection circuit, the positive power supply $V_{DD}$ stays at a level higher than the holding voltage of the SCR, so the SCR circuit will not be in latching after the overvoltage stress is released.

When the NMOS (31) in the turn-off switch (30) is initiated, the voltage drop through drain-to-source of the NMOS (31) is higher than the cut-off voltage of the PNP transistor (11) of the SCR (10), so the PNP transistor (11) allows electrostatic discharge to continue. Since the emitter of the PNP transistor (11) is coupled with a diode D1, the voltage through drain-to-source of the NMOS (31) is distributed to the diode D1, causing the PNP transistor (11) to be switched off, thus the ESD circuit is immune to latch-up.

When overvoltage stress develops over the input pad (PAD) in the reverse fast-transient mode, the SCR (10) will be partially turned on. The first path starts from the negative power supply $V_{SS}$, through the NPN transistor (12) of the SCR (10) (collector to base of NPN transistor), resistor $R_N$ to the input pad (PAD); the second path starts from the negative power supply $V_{SS}$ through the Zener diode (Z1), resistor $R_N$ to the input pad (PAD). Therefore, this ESD protection circuit is able to provide protection in reverse biased electrostatic discharge, wherein the body of the NMOS (31) is connected to the negative power supply $V_{SS}$, and the body of the PMOS (21) is connected to the positive power supply $V_{DD}$.

When overvoltage stress develops in the fast-transient mode, the transistor gating circuit (40) is used to control the 'on/off' time of the turn-on switch (20) and the turn-off switch (30), thus directing the operation of the SCR (10). By appropriately controlling the conduction period of the transistor gating circuit (40), the SCR (10) shall have enough time to release overvoltage stress in the fast-transient mode, so as to provide maximum protection in electrostatic discharge.

After overvoltage stress is released, if high voltage still remains at the input pad (PAD), it may cause damage to the circuit components. Therefore the use of a Zener diode (Z1) allows one part of the SCR (10) to continue in the discharge mode even after another part of the SCR (that is the NPN transistor) is switched off. This is because the high voltage over the input pad (PAD) turns on the Zener diode (Z1), so breakdown current is injected on the base of the PNP transistor (11), and forward current passes through the PNP transistor (11) of the SCR (10). At this time two discharging paths exist simultaneously, one starting from the input pad (PAD) through the Zener diode (Z1) to the negative power supply $V_{SS}$, and the other starting from the input pad (PAD) through the PNP transistor (11) to the negative power supply $V_{SS}$. Therefore, the SCR (10) is partially enabled to allow electrostatic discharge to continue.

Figure 3:
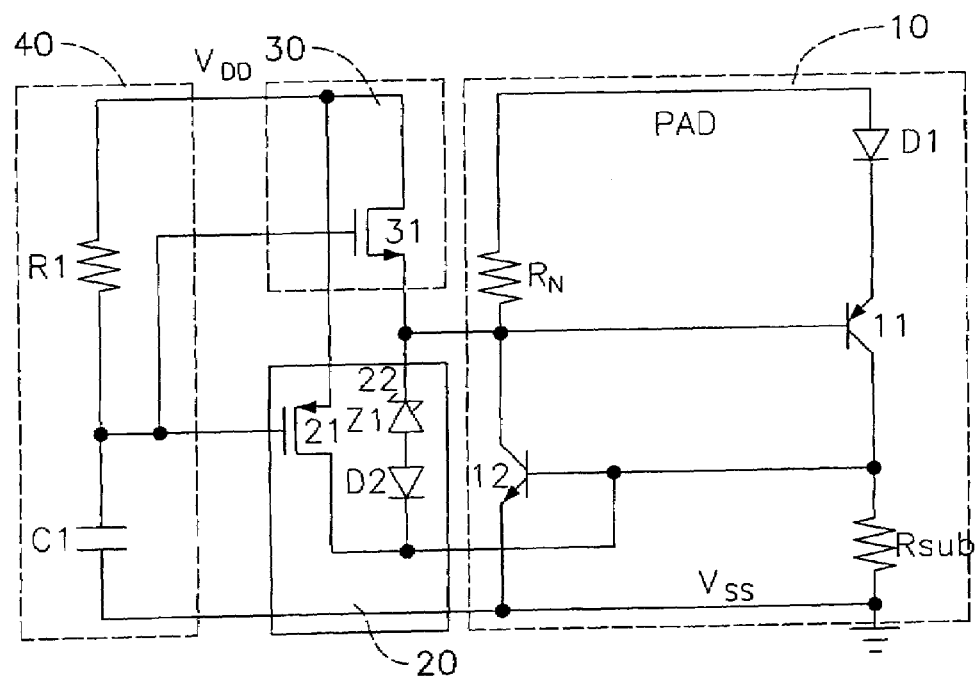
FIG. 3 is a circuit diagram of the second embodiment of the invention.

The architecture of another ESD protection circuit shown in FIG. 3 is similar to the previous example shown in FIG. 2, except that the Zener diode (Z1) of the voltage clamping circuit (22) is back-to-back connected with a diode D2, whereby the voltage clamping circuit (22) through the diode D2 is connected to the base of the NPN transistor (12) of the SCR (10), which enables the Zener diode (Z1) to effect reversed biased ESD protection over the input pad (PAD), and also to reduce leakage current of the Zener diode (Z1).

Figure 4:
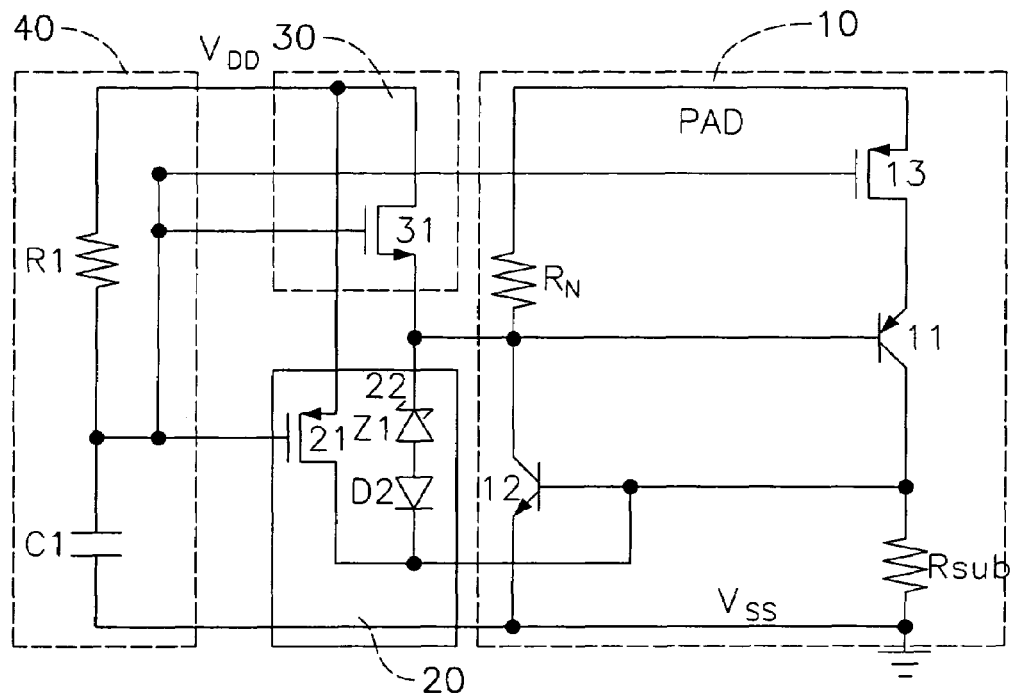
FIG. 4 is a circuit diagram of the third embodiment of the invention.

The unique feature of the third embodiment of the ESD protection circuit shown in FIG. 4 is that the SCR (10) employs a PMOS (13) to replace the diode. This PMOS (13) possesses the same functional characteristics as the diode. When overvoltage stress develops, the PMOS (13) initiates the PNP transistor (11) of the SCR (10). After overvoltage stress is released, the transistor gating circuit (40) sends out a high voltage pulse and a forward voltage is generated to cause the PMOS (13) to be disabled, thus the SCR (10) (that is the PNP transistor) will be switched off. The effect is similar to using the NMOS (31) of the turn-off switch (30) to switch off the PNP transistor of the SCR (10), except that the SCR (10) can be tripped at a faster rate.

When overvoltage stress develops over the input pad (PAD) in the forward fast-transient mode, the transistor gating circuit (40) sends out a low voltage pulse to cause the PMOS (13) of the turn-on switch (20) to be enabled. Since the voltage drop through the PMOS (13) is below the trigger voltage of the diode, the holding voltage of the SCR (10) will be lowered when the SCR (10) is in conduction, so better protection can be effected in electrostatic discharge.

Figure 5:
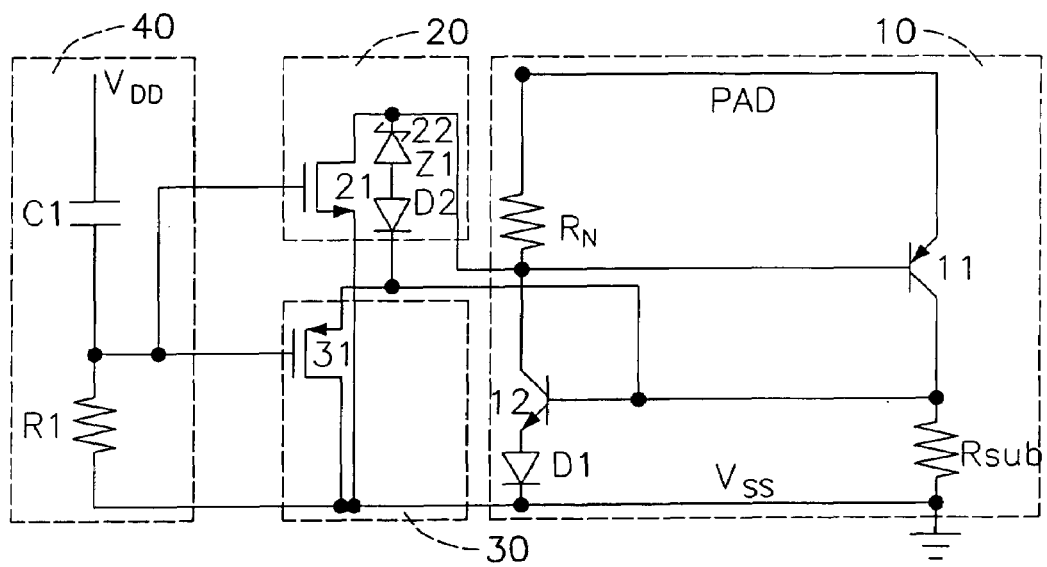
FIG. 5 is a circuit diagram of the fourth embodiment of the invention.

In the fourth embodiment, the SCR (10) as shown in FIG. 5, is formed by a PNP transistor (11) and an NPN transistor (12), both being bipolar junction transistors. The emitter of the PNP transistor (11) forms an anode of the SCR (10), and the base through a resistor $R_N$ is connected to the anode, and the collector of the PNP transistor (11) is connected to the base of the NPN transistor (12), and through a resistor $R_{SUB}$ is connected to the negative power supply $V_{SS}$ to form a cathode of the SCR (10). The emitter of the NPN transistor (12) is coupled with a diode D1, forming another cathode of the SCR (10). The bases of the PNP transistor and the NPN transistor act as the gate of the SCR (10).

The turn-on switch (20) is formed by an NMOS (21) and a voltage clamping circuit (22), wherein the drain of the NMOS (21) is connected to the base of the PNP transistor (11) of the SCR (10), and the gate is connected to the transistor gating circuit (40) to enable the SCR (10). The voltage clamping circuit (22) has a Zener diode (Z1) and a diode (D2) back-to-back, where the Zener diode (Z1) and a diode (D2) is connected across the bases of the PNP and NPN transistors (11) (12) of the SCR (10).

The turn-off switch (30) has a PMOS (31), where the source of the PMOS (31) is connected to the base of the NPN transistor (12) of the SCR (10), and the gate is connected to the transistor gating circuit (40) to trip the SCR (10).

In this example, the transistor gating circuit (40) is formed by an RC circuit containing a capacitor (C1) and a resistor (R1), wherein one end of the capacitor (C1) is connected to the positive power supply $V_{DD}$ (or the input pad), and another end is connected to the resistor (R1), and the junction is respectively connected to the gate of the NMOS (21) in the turn-on switch (20) and the gate of the PMOS (31) in the turn-off switch (30). By appropriately adjusting the capacitance of the capacitor C1 and the resistance of the resistor R1, the time constant of the RC circuit can be set to control the 'on/off' time of the turn-on switch (20) and the turn-off switch (30).

Having described the circuit architectures of different embodiments, their operations of the ESD protection circuits are to be explained below.

When overvoltage stress develops over the input pad (PAD) in the forward fast-transient mode, the transistor gating circuit (40) sends out a high voltage pulse and a forward voltage is generated to cause the NMOS (21) in the turn-on switch (20) to be enabled, so the NMOS (21) will trigger the PNP transistor (11) of the SCR (10) into conduction, and at the same time the Zener diode (Z 1) in the turn-on switch (20) will produce breakdown current to form another discharging path, causing the SCR (10) to be in conduction and the voltage over the input pad (PAD) will fall rapidly to the holding voltage of the SCR (10), so ESD protection is effected. After the overvoltage stress is released, the transistor gating circuit (40) sends out a low voltage pulse and a forward voltage is generated to cause the PMOS (31) in the turn-off switch (30) to be turned on, and the PMOS (31) switches off the SCR (10); whereas in the conventional circuit the supply voltage over the positive power supply $V_{DD}$ stays at a level higher than the holding voltage of the SCR even after the overvoltage stress is released, so the SCR circuit will be in latching indefinitely.

In this example, a diode D1, connected between the emitter of the NPN transistor (12) of the SCR (10) and the negative power supply $V_{SS}$, has the same functional characteristics as the diode D1 coupled to the emitter of the PNP transistor (11) shown in FIG. 2. When overvoltage stress develops in the reverse fast-transient mode, the SCR (10) will be partially turned on. The first discharging path starts from the negative power supply $V_{SS}$ through the SCR (10) (base to collector of the NPN transistor (12)), resistor $R_N$ to the input pad (PAD), and the second discharging path starts from the negative power supply $V_{SS}$ through the diode on the PMOS (31), SCR (10) (base to collector of the NPN transistor (12)), resistor $R_N$ to the input pad (PAD), and the third discharging path starts from the negative power supply $V_{SS}$ through the diode on the NMOS (21), resistor $R_N$ to the input pad (PAD). When reverse biased overvoltage stress develops, the ESD protection circuit is able to provide maximum ESD protection, wherein the body of the NMOS (21) is connected to the negative power supply $V_{SS}$, and the body of the PMOS (31) is connected to the positive power supply $V_{DD}$, however adequate circuit protection needs to be taken to prevent large current passing through the PMOS (31).

The transistor gating circuit (40) is used to control the 'on/off' time of the turn-on switch (20) and the turn-off switch (30), both of which are used to steer the operation of the SCR (10). By appropriately adjusting the RC constant of the transistor gating circuit (40), the SCR (10) will be enabled for sufficient time to allow the overvoltage stress over the SCR (10) to be released completely.

When the overvoltage stress is released, if high voltage still exists over the input pad (PAD) damage may be caused to the circuit components. The use of a Zener diode (Z1) of the SCR (10) allows the SCR (10) to continue discharge even after another part of the SCR (10) is switched off. This is because the high voltage over the input pad (PAD) causes the Zener diode (Z1) to be turned on, allowing breakdown current to pass through the PNP transistor (11) of the SCR (10). At this time, two discharging paths coexist in the SCR (10): the first one starts from the input pad (PAD) through the Zener diode (Z1) to the negative power supply $V_{SS}$, and the second one from the input pad (PAD) through the PNP transistor (11) to the negative power supply $V_{SS}$, thus the SCR (10) will remain partially enabled as long as the electrostatic discharge goes on.

Figure 6:
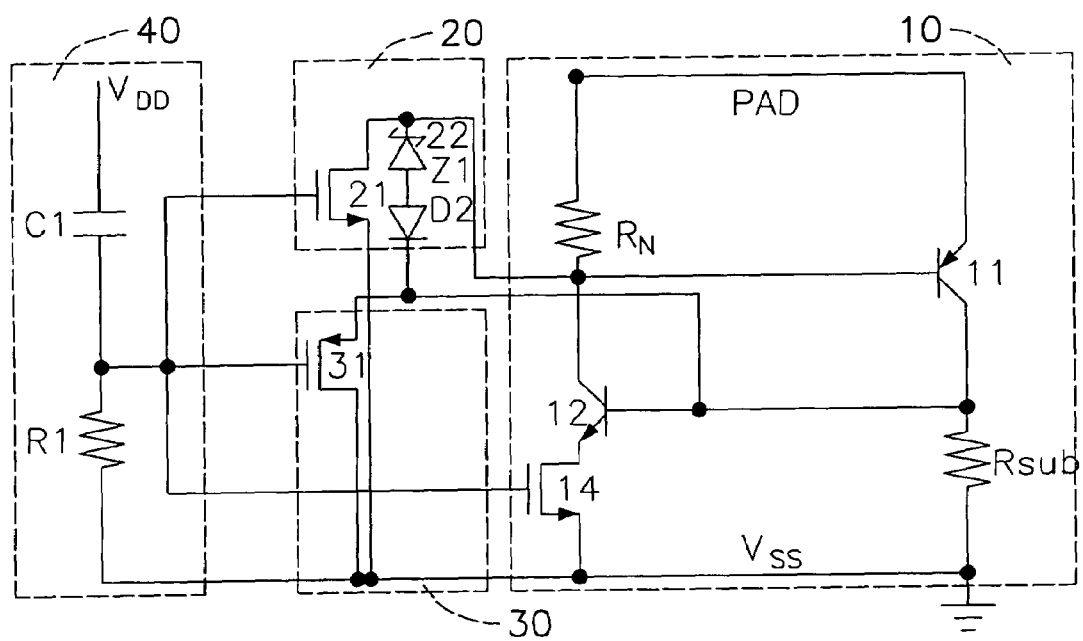
FIG. 6 is a circuit diagram of the fifth embodiment of the invention.
Figure 7:
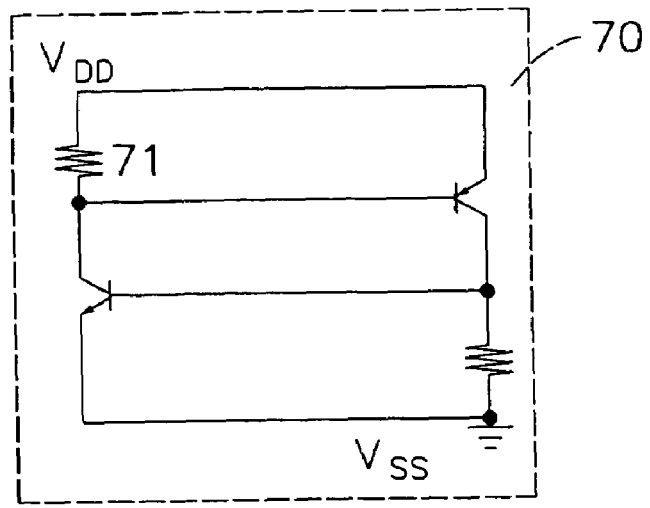
FIG. 7 is a circuit diagram of a conventional ESD protection circuit using SCR.
Figure 8:
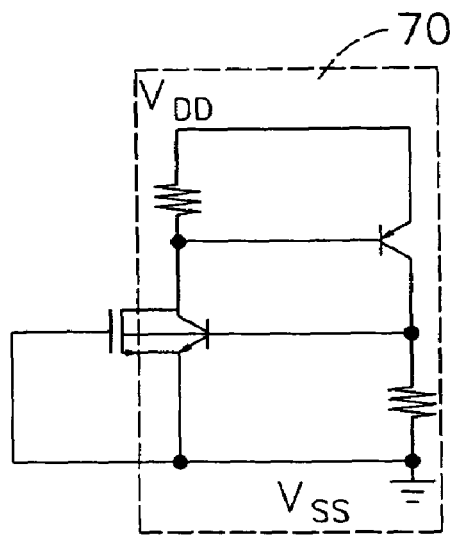
FIG. 8 is a circuit diagram of a conventional low voltage trigger SCR ESD protection circuit.
Figure 9:
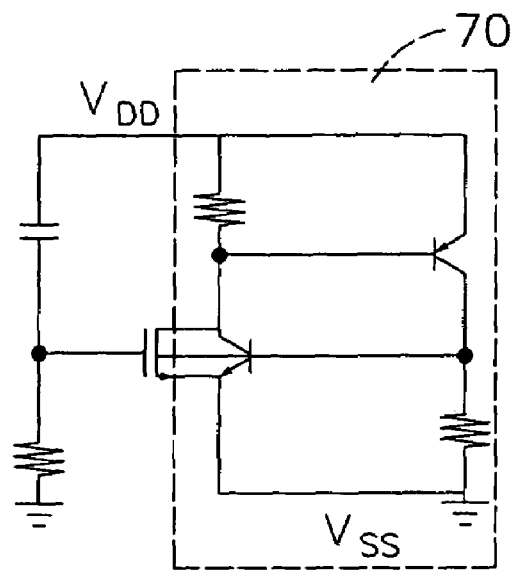
FIG. 9 is a circuit diagram of a conventional low voltage trigger gate coupled SCR ESD protection circuit.
Figure 10:
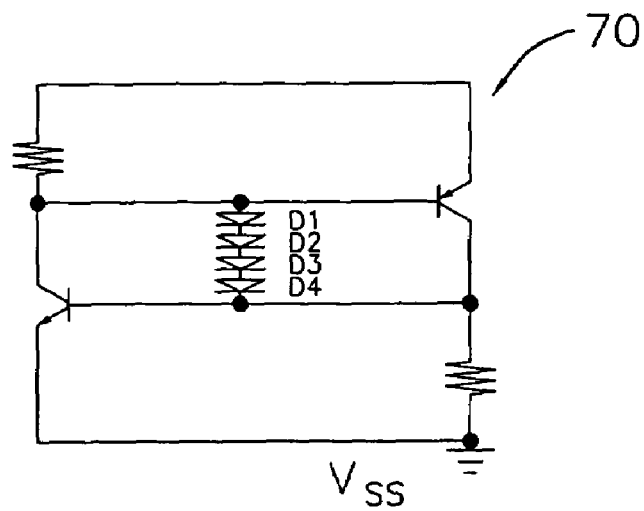
FIG. 10 is a circuit diagram of a conventional diode chain trigger SCR ESD protection circuit.
Figure 11:
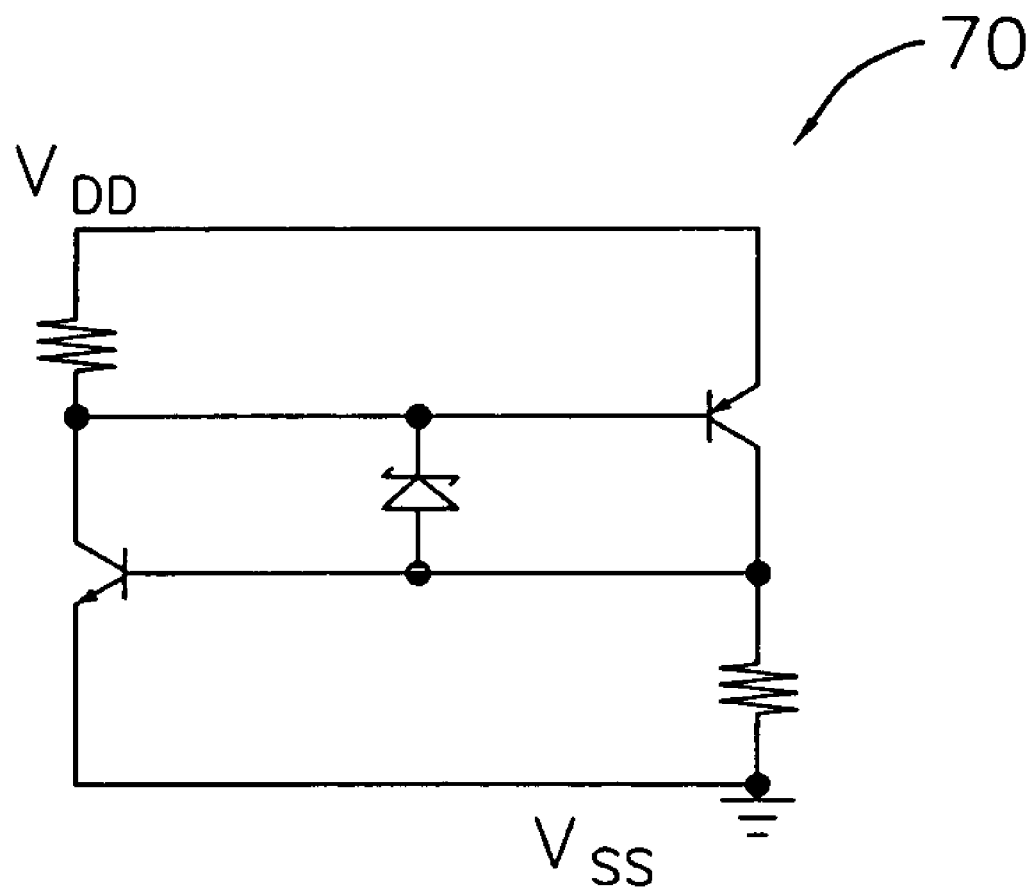
FIG. 11 is a circuit diagram of a conventional Zener diode trigger SCR ESD protection circuit.
Figure 12:
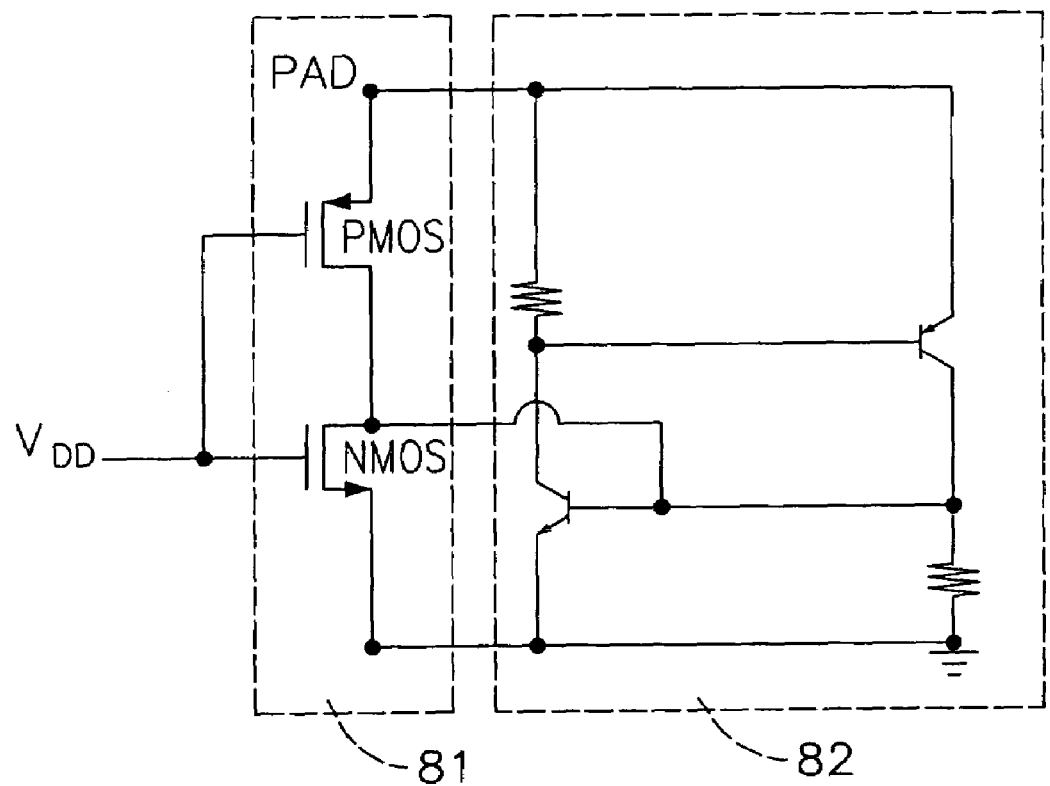
FIG. 12 is a circuit diagram of a conventional PMOS/NMOS trigger SCR ESD protection circuit.

The fifth embodiment of ESD protection circuit as shown in FIG. 6 employs an NMOS (14) to replace the diode D1 of the SCR (10).

When forward overvoltage stress develops, the transistor gating circuit (40) produces a high voltage pulse and a forward voltage is generated to cause the NMOS (14) in the turn-on switch (20) to be turned on. The function of the NMOS (14) is similar to that of PMOS (13) shown in FIG. 4, wherein the NMOS (14) is connected to the emitter of the PNP transistor (11). Since the voltage drop through the NMOS (14) is below the trigger voltage of the diode, when the SCR (10) remains in conduction, and the holding voltage is lowered, better protection can be achieved in electrostatic discharge.

According to the present invention, the SCR (10) is able to provide effective ESD protection, irrespective whether the overvoltage stress is developed in the fast-transient or quasi-static mode.

In conclusion, the present invention provides a technique to trigger an SCR into conduction whenever overvoltage stress develops over the input pad with fast switching of the SCR, so that high voltage over the input pad can be decreased rapidly to the level of the holding voltage of the SCR. Once the overvoltage stress is released, the Zener diode of the SCR allows the discharge to continue as long as the overvoltage stress still exists, irrespective of the operation mode of the semiconductor, and the holding voltage of the SCR is raised making it immune to latch-up.

It is to be understood, however, that even after numerous characteristics and advantages of the present invention have been set forth in the foregoing examples, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A latch-up-free ESD protection circuit using an SCR, comprising:
   an SCR (10) being connected across an input pad (PAD) and a negative power supply $V_{SS}$;
   a turn-on switch (20) being connected across a positive power supply $V_{DD}$ and a gate of the SCR (10) to initiate the SCR (10);
   a turn-off switch (30) being connected across the positive power supply $V_{DD}$ and the gate of the SCR (10) to switch off the SCR (10);
   a transistor gating circuit (40) being connected across the positive power supply $V_{DD}$ and the negative power supply $V_{SS}$, and also being connected to the turn-on switch (20) and the turn-off switch (30);
   whereby when overvoltage stress develops over the input pad (PAD) in a forward fast-transient mode, the transistor gating circuit (40) initiates the turn-on switch (20) to trigger the SCR (10) into conduction, so that high voltage over the input pad (PAD) is rapidly decreased to a holding voltage level of the SCR (10), thus the ESD protection circuit is immune to latch-up.

2. The ESD protection circuit according to claim 1, wherein the SCR (10) is formed by an NPN transistor (12) and a PNP transistor (11), wherein an emitter of the PNP transistor (11) is connected to the input pad (PAD) to form an anode of the SCR (10); a base of the PNP transistor (11) is connected by a resistor $R_N$, and the resistor $R_N$ is connected to the anode of the SCR (10); a collector of the PNP transistor (11) is connected to a base of the NPN transistor (12), and through a resistor $R_{SUB}$ is connected to the negative power supply $V_{SS}$ to form a cathode of the SCR (10); and the bases of the PNP transistor (11) and the base of the NPN transistor (12) act as the gate of the SCR.

3. The ESD protection circuit according to claim 2, wherein the emitter of the PNP transistor (11) is coupled to the input pad (PAD) through at least one diode (D1), and the base is connected to a junction connecting the turn-on switch (20) and the turn-off switch (30).

4. The ESD protection circuit according to claim 2, wherein the emitter of the PNP transistor (11) is coupled to the input pad (PAD) through a PMOS transistor (13), and the base is connected to a junction connecting the turn-on switch (20) and the turn-off switch (30).

5. The ESD protection circuit according to claim 1, wherein the SCR is formed by a PNP transistor (11) and an NPN transistor (12), wherein an emitter of the PNP transistor (11) forms an anode of the SCR (10); a base of the PNP transistor (11) is connected through a resistor $R_N$, to the anode of the SCR; a collector of the PNP transistor (11) is connected to a base of the NPN transistor (12), and further through a resistor $R_{SUB}$ connected to the negative power supply $V_{SS}$ to form a cathode of the SCR (10); and the bases of the PNP transistor (11) and the NPN transistor (12) act as the gate of the SCR (10).

6. The ESD protection circuit according to claim 5, wherein the emitter of the NPN transistor (12) is coupled with a diode (D1).

7. The ESD protection circuit according to claim 5, wherein the emitter of the NPN transistor (12) is coupled with an NMOS transistor (14), and the base of the NMOS transistor (14) is connected to the transistor gating circuit (40).

8. The ESD protection circuit according to claim 2, wherein the turn-on switch (20) has a PMOS transistor (21) connected between the positive power supply $V_{DD}$ and the base of NPN transistor (12) and the gate of the PMOS transistor (21) is connected to the transistor gating circuit (40).

9. The ESD protection circuit according to claim 5, wherein the turn-on switch (20) has an NMOS transistor (21) connected between the positive power supply $V_{DD}$ and the base of the PNP transistor (11), and the gate of the NMOS transistor (21) is connected to the transistor gating circuit (40).

10. The ESD protection circuit according to claim 8, wherein the turn-on switch (20) comprises a voltage clamping circuit (22) having a Zener diode and a diode (D2) connected back-to-back, the voltage clamping circuit (22) further connects across the bases of the PNP and NPN transistors (11) (12), whereby plural discharging paths are formed even after the SCR (10) is switched off.

11. The ESD protection circuit according to claim 9, wherein the turn-on switch (20) further comprises a voltage clamping circuit (22) having a Zener diode and a diode (D2) connected back-to-back, the voltage clamping circuit (22) further connects across the bases of the PNP and NPN transistors (11) (12), whereby plural discharging paths are formed even after the SCR (10) is switched off.

12. The ESD protection circuit according to claim 2, wherein a source of an NMOS transistor (31) of the turn-off switch (30) is connected to the base of PNP transistor (11) and a gate of the NMOS transistor (31) is connected to the transistor gating circuit (40).

13. The ESD protection circuit according to claim 3, wherein a source of an NMOS transistor (31) of the turn-off switch (30) is connected to the base of PNP transistor (11) and a gate of the NMOS transistor (31) is connected to the transistor gating circuit (40).

14. The ESD protection circuit according to claim 4, wherein a source of an NMOS transistor (31) of the turn-off switch (30) is connected to the base of PNP transistor (11) and a gate of the NMOS transistor (31) is connected to the transistor gating circuit (40).

15. The ESD protection circuit according to claim 8, wherein a source of an NMOS transistor (31) of the turn-off switch (30) is connected to the base of PNP transistor (11) and a gate of the NMOS transistor (31) is connected to the transistor gating circuit (40).

16. The ESD protection circuit according to claim 5, wherein a drain of a PMOS transistor (31) in the turn-off switch (30) is connected to the base of the NPN transistor (12) of the SCR (10), and the gate of the PMOS (31) is connected to the transistor gating circuit (40).

17. The ESD protection circuit according to claim 6, wherein a drain of a PMOS transistor (31) in the turn-off switch (30) is connected to the base of the NPN transistor (12) of the SCR (10), and the gate of the PMOS (31) is connected to the transistor gating circuit (40).

18. The ESD protection circuit according to claim 7, wherein a drain of a PMOS transistor (31) in the turn-off switch (30) is connected to the base of the NPN transistor (12) of the SCR (10), and the gate of the PMOS (31) is connected to the transistor gating circuit (40).

19. The ESD protection circuit according to claim 9, wherein the drain of a PMOS transistor (31) in the turn-off switch (30) is connected to the base of the NPN transistor (12) of the SCR (10), and the gate of the PMOS (31) is connected to the transistor gating circuit (40).

20. The ESD protection circuit according to claim 1, wherein the transistor gating circuit (40) is formed by a capacitor and a resistor connected in series, and a junction between the capacitor and the resistor is respectively connected to the gates of the PMOS (21) of the turn-on switch (20) and the NMOS (31) of the turn-off switch (30), whereby through appropriate adjustment of capacitance and resistance values a time constant is tuned to control 'on/off' time of the turn-on switch (20) and the turn-off switch (30).

* * * * *